(12) United States Patent
Hyobu et al.

(10) Patent No.: US 8,480,348 B2
(45) Date of Patent: *Jul. 9, 2013

(54) THIN PLATE CONTAINER AND PROCESSING APPARATUS FOR THIN PLATE CONTAINER

(75) Inventors: Yukihiro Hyobu, Tokyo (JP); Atsushi Osada, Kofu (JP)

(73) Assignee: Miraial Co., Ltd., Tokyo (JP)

( * ) Notice: Subject to any disclaimer, the term of this patent is extended or adjusted under 35 U.S.C. 154(b) by 696 days.

This patent is subject to a terminal disclaimer.

(21) Appl. No.: 11/992,588

(22) PCT Filed: Sep. 20, 2006

(86) PCT No.: PCT/JP2006/318582
§ 371 (c)(1),
(2), (4) Date: Aug. 17, 2009

(87) PCT Pub. No.: WO2007/040047
PCT Pub. Date: Apr. 12, 2007

(65) Prior Publication Data
US 2009/0297303 A1 Dec. 3, 2009

(30) Foreign Application Priority Data
Sep. 30, 2005 (JP) .................................. 2005-288211

(51) Int. Cl.
*B65G 1/00* (2006.01)
(52) U.S. Cl.
USPC ............................ 414/304; 206/710; 206/509
(58) Field of Classification Search
USPC ........................... 206/710, 509; 414/304, 941
See application file for complete search history.

(56) References Cited

U.S. PATENT DOCUMENTS

| | | | | |
|---|---|---|---|---|
| 2,623,656 A | * | 12/1952 | Rottau | 220/8 |
| 3,511,990 A | * | 5/1970 | Hauss | 378/187 |
| 3,549,018 A | * | 12/1970 | Wilson | 211/126.2 |
| 3,552,548 A | * | 1/1971 | Wallestad et al. | 206/710 |
| 3,615,006 A | * | 10/1971 | Freed | 206/454 |
| 3,695,424 A | | 10/1972 | Cristy et al. | |
| 3,719,273 A | * | 3/1973 | Abe | 206/712 |
| 4,081,151 A | * | 3/1978 | Ender et al. | 242/605 |
| 4,681,221 A | * | 7/1987 | Chickanosky et al. | 206/719 |

(Continued)

FOREIGN PATENT DOCUMENTS

| | | |
|---|---|---|
| JP | 63-138984 | 6/1988 |
| JP | 4-116135 | 4/1992 |

(Continued)

*Primary Examiner* — Joshua Rudawitz
(74) *Attorney, Agent, or Firm* — Bacon & Thomas PLLC

(57) ABSTRACT

Arbitrary pieces of semiconductor wafers are supported flexibly on either the upper side or the lower side. The present invention is a thin plate container for supporting plural semiconductor wafers for use in carriage, storage, processing, etc. It comprises processing trays plurally stacked in a state of each supporting at least one semiconductor wafer individually and a coupling mechanism for integrally coupling the processing trays in a state where the processing trays are plurally stacked and separating the processing trays at an arbitrary location. Each processing tray has a one-side support for supporting at least one semiconductor wafer on its one side and the other-side support mutually fitted to the one-side support of the other processing tray on the other side to form a housing space sealed off from the external environment for constraining and supporting the thin plate. Accordingly, as many processing trays as the number of the semiconductor wafers are stacked to constitute the thin plate container.

8 Claims, 4 Drawing Sheets

U.S. PATENT DOCUMENTS

| | | | |
|---|---|---|---|
| 5,314,068 A * | 5/1994 | Nakazato et al. | 206/454 |
| 5,325,966 A * | 7/1994 | Chang | 206/372 |
| 5,353,946 A * | 10/1994 | Behrend | 220/326 |
| 5,427,265 A * | 6/1995 | Cautereels et al. | 220/318 |
| 5,544,751 A * | 8/1996 | Klodt et al. | 206/509 |
| D383,306 S * | 9/1997 | Pennoyer | D3/294 |
| 5,697,500 A * | 12/1997 | Walker | 206/509 |
| 5,848,703 A * | 12/1998 | Murphy et al. | 206/725 |
| D418,978 S * | 1/2000 | Pennoyer, Jr. | D3/273 |
| 6,216,873 B1 * | 4/2001 | Fosnight et al. | 206/710 |
| 6,581,264 B2 | 6/2003 | Ohori et al. | |
| 6,837,374 B2 * | 1/2005 | Nigg et al. | 206/454 |
| 7,209,220 B2 * | 4/2007 | Puerto et al. | 355/75 |
| 7,304,720 B2 * | 12/2007 | del Puerto et al. | 355/75 |
| 7,420,655 B2 * | 9/2008 | Matsutori et al. | 355/75 |
| 7,450,219 B2 * | 11/2008 | Matsutori et al. | 355/75 |
| 7,504,315 B2 * | 3/2009 | Matsubara et al. | 438/455 |
| 7,528,936 B2 * | 5/2009 | Gregerson et al. | 355/72 |
| 7,624,870 B2 * | 12/2009 | Nishizaka et al. | 206/454 |
| 7,743,925 B1 * | 6/2010 | Lu et al. | 206/710 |
| 7,854,327 B2 * | 12/2010 | Hyobu | 206/710 |
| 8,011,503 B2 * | 9/2011 | Hartman | 206/308.1 |
| 8,079,477 B2 * | 12/2011 | Kasama | 206/710 |
| 8,353,404 B2 * | 1/2013 | Chiu | 206/710 |
| 2001/0023839 A1 * | 9/2001 | Kunii et al. | 206/711 |
| 2003/0089313 A1 * | 5/2003 | Ham et al. | 118/500 |
| 2005/0069402 A1 * | 3/2005 | Yoshizawa et al. | 414/286 |
| 2005/0147488 A1 | 7/2005 | Matsubara et al. | |
| 2006/0109449 A1 * | 5/2006 | Matsutori et al. | 355/75 |
| 2006/0201958 A1 * | 9/2006 | Tieben et al. | 220/835 |
| 2006/0237338 A1 * | 10/2006 | Nakamae | 206/316.1 |
| 2006/0260978 A1 * | 11/2006 | Gregerson et al. | 206/710 |
| 2007/0068846 A1 * | 3/2007 | Hsiao | 206/710 |
| 2007/0227940 A1 * | 10/2007 | Chiu | 206/710 |
| 2008/0173560 A1 * | 7/2008 | Umeda et al. | 206/316.1 |
| 2009/0250374 A1 * | 10/2009 | Kasama et al. | 206/711 |

FOREIGN PATENT DOCUMENTS

| | | |
|---|---|---|
| JP | 05-16984 | 1/1993 |
| JP | H10-50815 | 2/1998 |
| JP | 10-147313 | 6/1998 |
| JP | 2004-273867 | 9/2004 |
| JP | 2005-197628 | 7/2005 |

* cited by examiner

THIN PLATE CONTAINER AND PROCESSING APPARATUS FOR THIN PLATE CONTAINER

TECHNICAL FIELD

The present invention relates to a thin plate container for supporting thin plates for electronic devices such as semiconductor wafers, magnetic recording medium disks, optical recording medium disks, glass substrates for liquid crystal, film substrates for flexible display apparatuses, and so on for carriage, storage, processing, etc. and a processing apparatus for a thin plate container.

BACKGROUND ART

Recently, there is a demand for further thinning of a thin plate for an electronic device such as a semiconductor wafer. Thus, each thin plate gets extremely thin and is easy to break regardless of its dimension. As a container for housing, storing, and carrying such an extremely thin plate, a multistage type housing cassette described in Reference Document 1 is known. This multistage type housing cassette is a housing cassette that can carry out an extremely thin wafer having a thickness of 20 to 100 micrometers without causing chipping on its circumferential surface and without causing a suction error to a pad. Specifically, as shown in FIG. 2, it is a multistage type housing cassette 6 arranging vertically in parallel via supports 5 to be spaced equally a plurality of housing shelves 2 in each of which a semicircular guide 4 having a slightly larger diameter than the diameter of an extremely thin wafer w stands from a flat plate 3. A suction pad of a carrier robot is moved over the upper surface of the wafer w and is then lowered and thrusts the wafer on the flat plate to eliminate warpage of the wafer, and thereafter the wafer is attracted by suction and constrained to the suction pad.
Patent Document 1: Japanese patent No. 2004-273867

DISCLOSURE OF THE INVENTION

Problems to be Solved by the Invention

Meanwhile, in the aforementioned multistage type housing cassette, the rim portion of the extremely thin wafer w is just supported from its lower side, and no means for constraining the extremely thin wafer w is particularly provided. Accordingly, since the extremely thin wafer w may be displaced and broken when the multistage type housing cassette is inclined, the wafer needs to be carried carefully. As a result, a problem of poor operability at the time of carriage occurs.

Also, along with a recent large-size trend of a glass substrate for liquid crystal, etc., the glass substrate for liquid crystal has been tested in a state of being inclined in numerous cases, but in the aforementioned multistage type housing cassette, the extremely thin wafer w housed therein cannot be inclined. Thus, there is a problem of not being able to use the aforementioned multistage type housing cassette in testing phases.

Means to Solve the Problems

The present invention is provided in view of the above aspects and is a thin plate container suitable for carriage, storage, processing, etc. of an extremely thin plate and is one that has been improved so as to carry, store, process, etc. small-sized to large-sized thin plates safely and reliably.

Specifically, the present invention is a thin plate container for supporting one or plural thin plates for use in carriage, storage, processing, etc., comprising processing trays plurally stacked in a state of each supporting at least one thin plate individually, and a coupling mechanism for integrally coupling the processing trays in a state where the processing trays are plurally stacked and separating the processing trays at an arbitrary location, wherein each processing tray has a one-side support for supporting at least one thin plate on its one side and the other-side support mutually fitted to the one-side support of the other processing tray on the other side to form a housing space sealed off from the external environment for constraining and supporting the thin plate, and wherein as many processing trays as the number of the thin plates are stacked.

Preferably, the one-side support and the other-side support are fitted to each other to sandwich and constrain the thin plate housed in the housing space, and regardless of which is on the upper side, the one-side support or the other-side support, the one-side support or the other-side support, whichever is on the lower side, supports the thin plate. Preferably, the coupling mechanism consists of a coupling portion provided on one side of each processing tray and a coupled portion provided on the other side and coupled with the coupling portion, and these coupling portion and coupled portion are coupled and constrained to cause adjacent processing trays to be coupled each other and to constrain the entirety integrally, and the coupling portion and the coupled portion at an arbitrary location are separated to enable separation into two at the location. Preferably, the coupling mechanism is constituted to comprise a guide means for supporting and guiding each processing tray and a clamp for integrally constraining the entire processing trays each supported and guided by the guide means and separating them into two at an arbitrary location. Preferably, on each processing tray located at both ends among the processing trays is formed a kinematic groove to be attached to a processing apparatus, and the one-side support supports the thin plate in a case where one side of each processing tray is directed upward and the other-side support supports the thin plate in a case where the other side is directed upward. Preferably, a gasket for sealing off the housing space is provided at the fitting portion between the one-side support and the other-side support of each processing tray.

Also, a processing apparatus for a thin plate container comprises a mounting table for mounting the aforementioned thin plate container, a separation mechanism for separating and opening the thin plate container mounted on the mounting table at an arbitrary location, and a loader/unloader for loading in and out a thin plate housed at the portion opened by the separation mechanism.

Preferably, the separation mechanism is composed of a release key for separating processing trays of the thin plate container at an arbitrary location and a lift for lifting each processing tray at the location separated by the release key.

EFFECT OF THE INVENTION

Since the present invention is constituted to comprise processing trays plurally stacked in a state of each supporting at least one thin plate individually, and a coupling mechanism for integrally coupling the processing trays in a state where the processing trays are plurally stacked and separating the processing trays at an arbitrary location, the number of the processing trays can be set arbitrarily in accordance with the number of the thin plates, and the stacked processing trays are separated at an arbitrary location to enable the thin plate to be carried in and out at the arbitrary location.

Also, since each processing tray has a one-side support on its one side and the other-side support on the other side, when two processing trays are stacked, the one-side support and the other-side support are fitted to each other to form a housing space, and the thin plate can be constrained and supported in this housing space in a state of being sealed off from the external environment.

Also, since the one-side support and the other-side support are fitted to each other to sandwich and constrain the thin plate housed in the housing space, and regardless of in which direction the thin plate container is disposed, a vertical, horizontal, or tilted direction, either the one-side support or the other-side support functions as a lid side, and the other functions as a container side, to support the thin plate, the upper and lower sides of the thin plate container do not need to be distinguished at the time of carriage or storage of the thin plate container or loading-in/out of the thin plate in processing phases.

Also, since the coupling mechanism consists of a coupling portion provided on one side of each processing tray and a coupled portion provided on the other side and coupled with the coupling portion, and the coupling portion and the coupled portion of adjacent processing trays are coupled and constrained to constrain the entirety integrally, and the coupling portion and the coupled portion at an arbitrary location are separated to enable separation into two at the location, the thin plate container can be carried in a state where the entirety is constrained integrally, and then the processing trays can be separated at an arbitrary location, and the thin plate at the location can be carried out for specific processings.

Also, since the coupling mechanism is constituted to comprise a guide means for supporting and guiding each processing tray and a clamp for integrally constraining the entire processing trays each supported and guided by the guide means and separating the processing trays into two at an arbitrary location, the thin plate container can be carried in a state where the entirety is constrained integrally, and then the processing trays can be separated at an arbitrary location, and the thin plate at the location can be carried out for specific processings, in a similar manner to the above.

Also, since on each processing tray located at both ends among the processing trays is formed a kinematic groove to be attached to a processing apparatus, and the one-side support supports the thin plate in a case where one side of each processing tray is directed upward and the other-side support supports the thin plate in a case where the other side is directed upward, the thin plate container can be attached to the processing apparatus regardless of which is directed upward, the upper side or the lower side. Also, even in a case where it is arranged in a horizontal or tilted direction, the thin plate is never displaced, and the thin plate container can be attached reliably to the processing apparatus that accepts the horizontal or tilted arrangement.

Also, since a gasket for sealing off the housing space is provided at the fitting portion between the one-side support and the other-side support of each processing tray, the inside of the housing space can be kept clean.

Also, since a processing apparatus for a thin plate container is constituted to comprise a mounting table for mounting the aforementioned thin plate container, a separation mechanism for separating and opening the thin plate container mounted on the mounting table at an arbitrary location, and a loader/unloader for loading in and out a thin plate housed at the portion opened by the separation mechanism, the thin plate container mounted on the mounting table is divided and opened at the arbitrary location by the separation mechanism, and the thin plate is carried in and out by the loader/unloader, thus to be able to carry in and out the thin plate at the arbitrary location easily.

Also, since the separation mechanism is composed of a release key for separating processing trays of the thin plate container at an arbitrary location and a lift for lifting each processing tray at the location separated by the release key, the stacked processing trays can be separated by the release key and be lifted up by the lift, and the stacked processing trays can be separated at the arbitrary location to carry in and out the thin plate.

Figure 1:
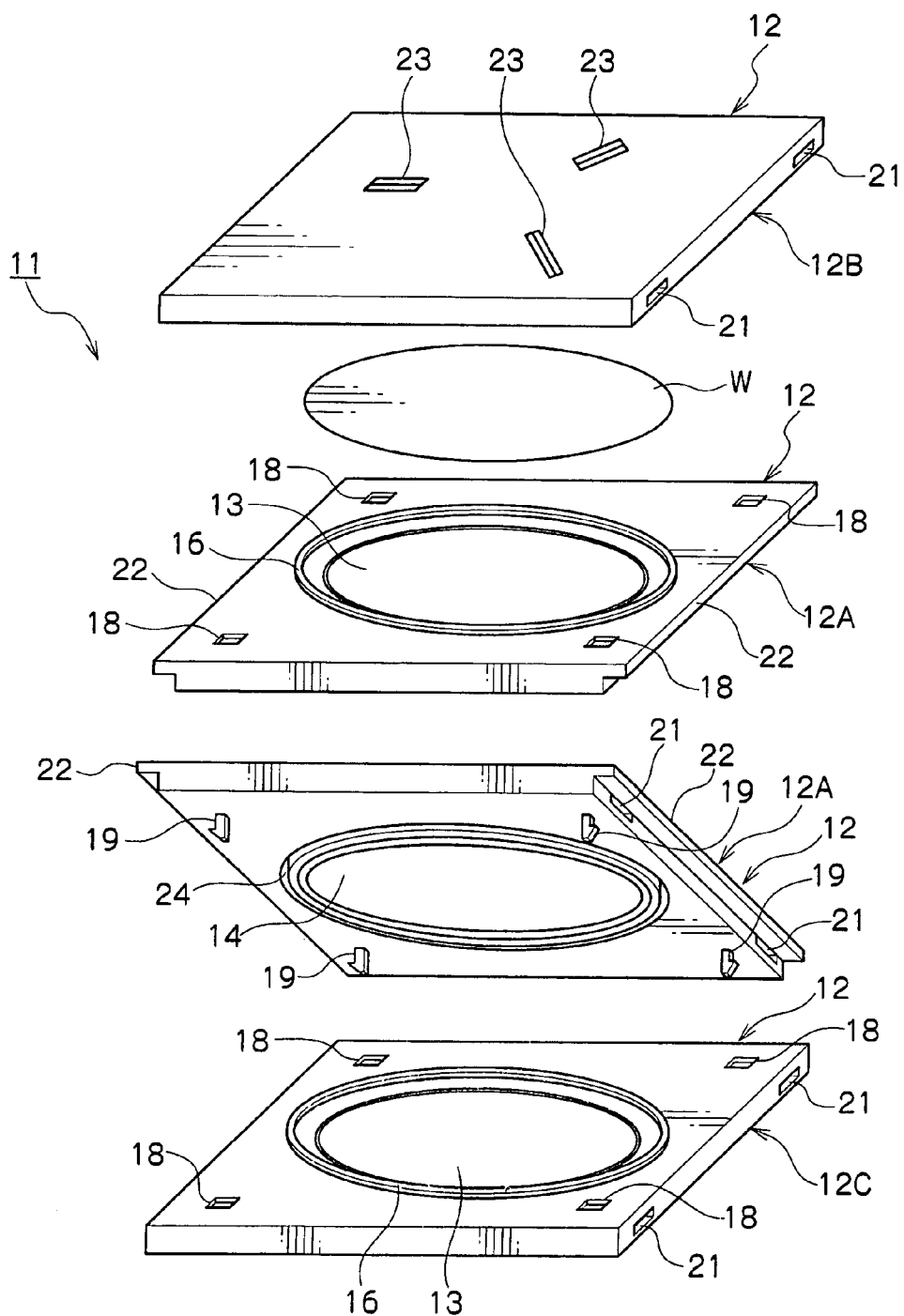
FIG. 1 is an exploded perspective view showing a thin plate container according to the embodiment of the present invention.
Figure 2:
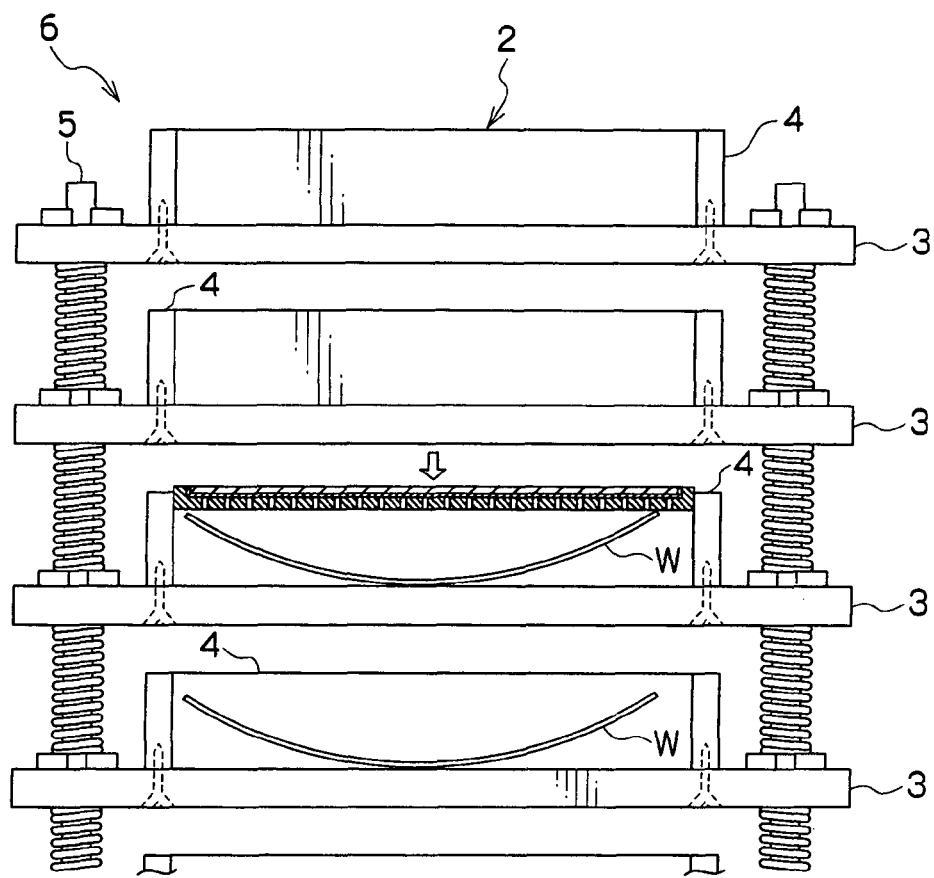
FIG. 2 is a front view showing a conventional thin plate container.

DESCRIPTION OF THE SYMBOLS 11 thin plate container
12 processing tray
12A intermediate processing tray
12B top end processing tray
12C bottom end processing tray
13 one-side support
14 the other-side support
16 annular projected portion
23 kinematic groove
24 annular groove
31 processing apparatus
32 mounting table
33 separation mechanism
34 loader/unloader
36 release key
37 lift
38 guide rail
39 guide rail
W semiconductor wafer

BEST MODE FOR CARRYING OUT THE INVENTION

Hereinafter, an embodiment of the present invention will be described with reference to the attached drawings. A thin plate container according to the present invention is a container that houses extremely thin plates for electronic devices such as semiconductor wafers, magnetic recording medium disks, optical recording medium disks, glass substrates for liquid crystal, film substrates for flexible display apparatuses, and so on for carriage, storage, and use in processing phases (such as manufacturing lines). It is noted that the present embodiment will be described taking a thin plate container for housing extremely thin semiconductor wafers as an example. Also, since extremely thin semiconductor wafers are easy to break regardless of their dimensions, the present embodiment can be applied to semiconductor wafers of all kinds of dimensions.

A thin plate container 11 is composed of plurally stacked processing trays 12 as shown in FIG. 1. Each processing tray 12 is a tray to support at least one, that is, one or several (two pieces are piled, for example, or three or more pieces may be piled in some cases) extremely thin semiconductor wafers W. The processing trays 12 are constituted by one or several intermediate processing trays 12A, a top end processing tray 12B located at the top end, and a bottom end processing tray 12C located at the bottom end. Each processing tray 12 is entirely formed in a square plate shape, and its size is set in accordance with the size of the semiconductor wafer W. For example, it is set in accordance with a semiconductor wafer W having a diameter of 300 mm and a thickness of 50 to 150 micrometers. It is noted that a protective film may be attached to the surface of the semiconductor wafer W, in which case the thickness increases as much as the thickness of the protective film.

The intermediate processing tray 12A out of the respective processing trays 12 has a one-side support 13 on its one side (upper side in FIG. 1) and the other-side support 14 on the other side.

The one-side support 13 is a portion to support at least one semiconductor wafer W. The one-side support 13 is formed at the center of the square plate-shaped intermediate processing tray 12A to be concaved in a circular shape. The diameter of this circular-shaped concave is approximately slightly larger than the diameter of the semiconductor wafer W. The depth of the concave is approximately deep enough to house several-ply semiconductor wafers W.

On the rim portion of the one-side support 13 is provided an annular projected portion 16. The annular projected portion 16 is formed to be annularly projected. This annular projected portion 16 is fitted into an after-mentioned annular groove 24 of the other-side support 14 to form a housing space sealed off from the external environment for constraining and supporting the semiconductor wafer W. This one-side support 13 is provided at the bottom end processing tray 12C as well as each intermediate processing tray 12A. It is not provided at the top end processing tray 12B.

At four corners on one side of the intermediate processing tray 12A are provided coupling holes 18. These coupling holes 18 are holes with which after-mentioned coupling hooks 19 on the lower side of the intermediate processing tray 12A are coupled to couple the two intermediate processing trays 12 each other. Each coupling hole 18 has inside a mechanism to be coupled with each coupling hook 19. This mechanism has a general configuration in which it is hooked on the coupling hook 19 to constrain them and is unhooked to release the constraining. The coupling hole 18 and the coupling hook 19 are adapted to be coupled when the coupling hook 19 is thrust in the coupling hole 18, and the coupling is adapted to be released when a release key 36 (refer to FIG. 6) is inserted into an after-mentioned coupling operation hole 21. These coupling holes 18 are provided at the bottom end processing tray 12C as well as each intermediate processing tray 12A. They are not provided at the top end processing tray 12B.

At the four corners on the other side of the intermediate processing tray 12A are provided the coupling hooks 19. These coupling hooks 19 are hooks that are coupled with the aforementioned coupling holes 18 to couple the two intermediate processing trays 12 each other. Each coupling hook 19 has a lock claw at its tip end portion and is adapted to be coupled with the aforementioned coupling hole 18 by this lock claw. These coupling hooks 19 are provided at the top end processing tray 12B as well as each intermediate processing tray 12A. They are not provided at the bottom end processing tray 12C.

Thus, the aforementioned coupling hole 18 and the coupling hook 19 constitute a coupling mechanism consisting of a coupling portion and a coupled portion. That is, a coupling mechanism in which mutual coupling causes the adjacent processing trays 12 to be coupled and constrained to each other is constituted.

At a location facing each coupling hole 18 at the peripheral end portion of the intermediate processing tray 12A is provided the coupling operation hole 21. This coupling operation hole 21 is a hole for releasing the coupling and separating the two intermediate processing trays 12 from the state where the coupling hook 19 is coupled with the coupling hole 18 to couple the two intermediate processing trays 12 each other. The coupling is adapted to be released by inserting the release key 36 into this coupling operation hole 21. These coupling operation holes 21 are provided at the top end processing tray 12B and the bottom end processing tray 12C as well as the intermediate processing tray 12A.

At the two opposing sides of the intermediate processing tray 12A are provided flanges 22. These flanges 22 are portions that catch arms of a processing apparatus 31 (refer to FIG. 6) to lift the intermediate processing tray 12A. By inserting the release keys 36 (refer to FIG. 6) of the processing apparatus 31 into the coupling operation holes 21 to release the coupling and letting the arms catch the flanges 22 so as to lift the intermediate processing tray 12A, the thin plate container 11 is adapted to be divided at the location of that intermediate processing tray 12A. That is, plural processing trays 12 are adapted to be integrally coupled in a stacked state and be separated into two at an arbitrary location. The flanges 22 are provided only at the intermediate processing tray 12A. Meanwhile, in a case where the intermediate processing tray 12A that is coupled with the top end processing tray 12B has the one-side support 13, the flanges 22 are provided at the top end processing tray 12B as well.

Figure 3:
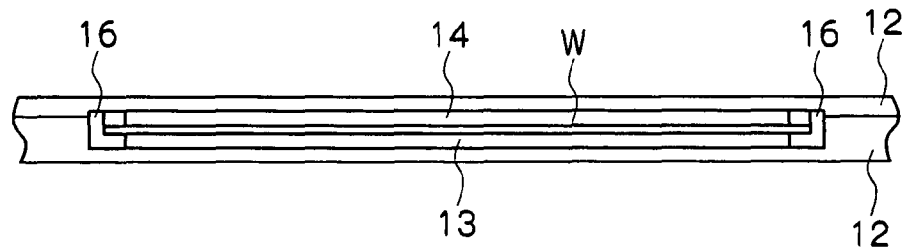
FIG. 3 is a cross-sectional view showing a state where two processing trays of the thin plate container of the present invention are stacked.

The other-side support 14 on the other side (lower side) of the intermediate processing tray 12A is a portion fitted to the one-side support 13 of the processing tray 12 located on the lower side to form a housing space sealed off from the external environment and fitted to the one-side support 13 to sandwich the semiconductor wafer W. The other-side support 14 is formed to be projected in a circular shape from the lower side of the intermediate processing tray 12A. This projection of the other-side support 14 is set to have a diameter enabling the other-side support 14 and the one-side support 13 to sandwich the semiconductor wafer W as shown in FIG. 3. Specifically, since the diameter of the projection of the other-side support 14 differs depending on the thickness and the number of the semiconductor wafers W to be housed, it is set in accordance with the number, etc. Accordingly, the one-side support 13 and the other-side support 14 are fitted to each other to sandwich and constrain the semiconductor wafer W housed in the aforementioned housing space, and regardless of which is on the upper side, the one-side support 13 or the other-side support 14, the one-side support 13 or the other-side support 14, whichever is on the lower side, is adapted to support the semiconductor wafer W. That is, either the one-side support 13 or the other-side support 14 is adapted to function as a lid side, and the other is adapted to function as a container side, to support the semiconductor wafer W. Even in a case where they are tilted or turned sideways, either the one-side support 13 or the other-side support 14 is adapted to function as a lid side, and the other is adapted to function as a container side, to support the semiconductor wafer W in a similar manner.

On the periphery of the other-side support 14 is provided the annular groove 24 as shown in FIG. 1. This annular groove 24 is a portion into which the aforementioned annular projected portion 16 of the one-side support 13 is fitted to form a housing space sealed off from the external environment.

This the other-side support 14 is provided at the top end processing tray 12B as well as the intermediate processing tray 12A. It is not provided at the bottom end processing tray 12C.

Meanwhile, a gasket is attached to the annular groove 24 as needed. In a case where one desires to seal off the aforementioned housing space, the gasket is provided. In a case where one desires to just let the semiconductor wafer W to be supported and does not need to seal off the housing space, no gasket is provided.

On the upper side of the top end processing tray 12B and the lower side of the bottom end processing tray 12C are formed kinematic grooves 23. The kinematic grooves 23 are portions to be attached to the processing apparatus 31 and are formed to conform to the structure of a mounting table 32 of the processing apparatus 31. Accordingly, regardless of which is mounted on the mounting table 32, the top end processing tray 12B or the bottom end processing tray 12C, the top end processing tray 12B or the bottom end processing tray 12C, whichever is directed upward, is adapted to support the semiconductor wafer W.

Figure 4:
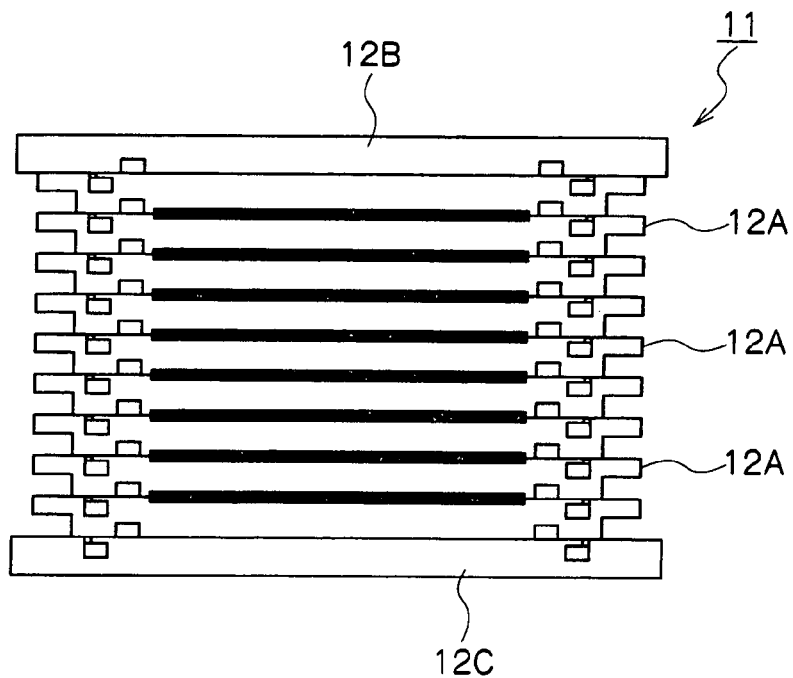
FIG. 4 is a front view showing the thin plate container according to the embodiment of the present invention.
Figure 5:
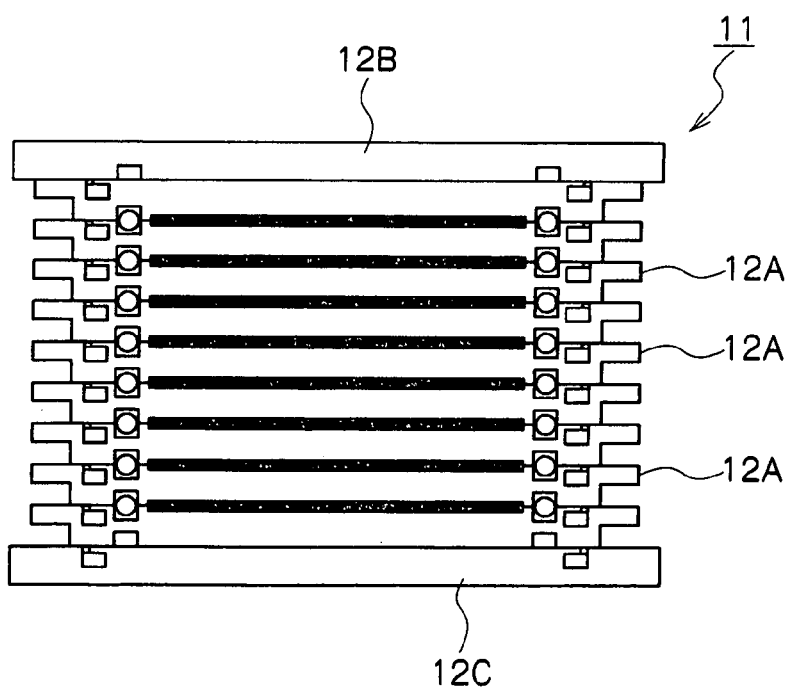
FIG. 5 is a side view showing the thin plate container according to the embodiment of the present invention.
Figure 6A:
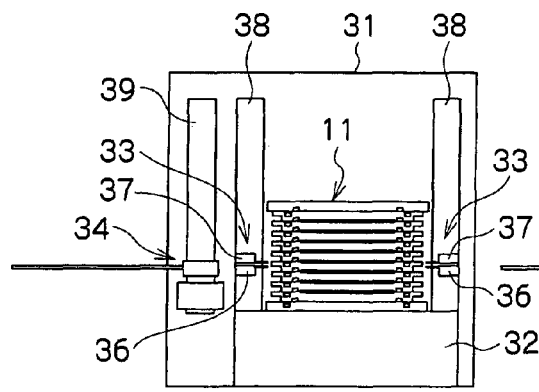
FIG. 6 is a schematic view showing operations of a processing apparatus on which the thin plate container of the present invention is mounted.
Figure 6B:
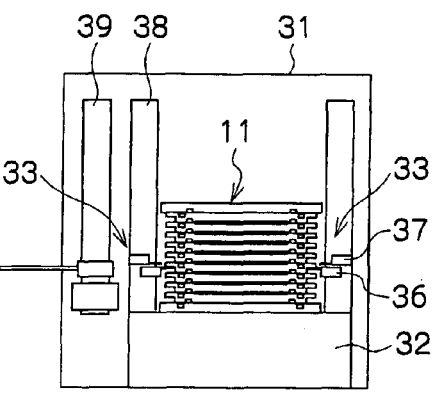
Figure 6C:
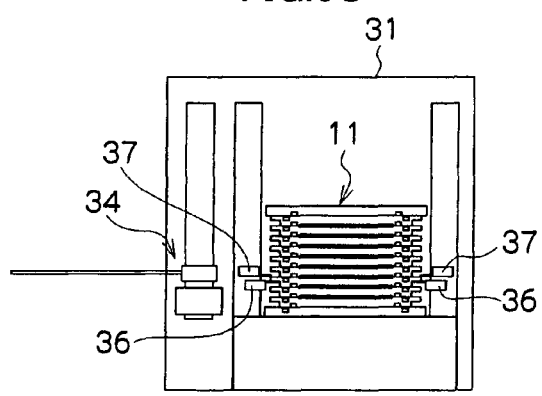
Figure 6D:
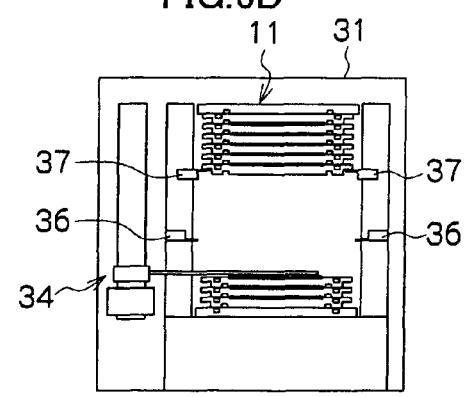
Figure 6E:
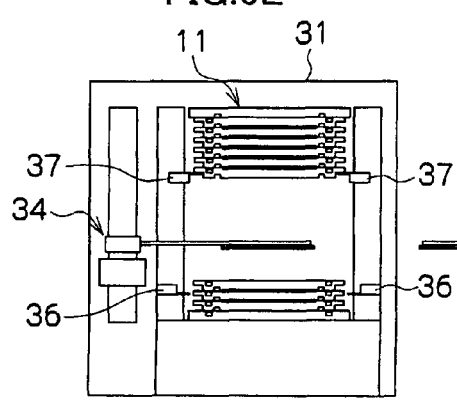
Figure 6F:
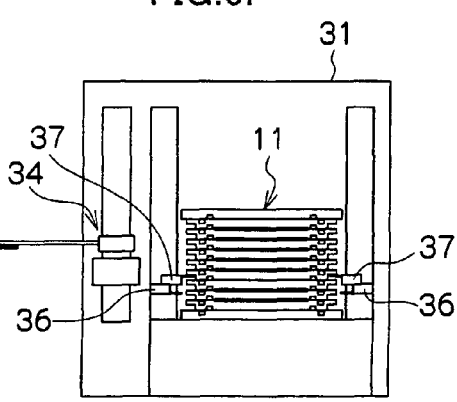

As many processing trays 12, constituted as such, as the number of the semiconductor wafers W are stacked and are integrally coupled as shown in FIGS. 4 and 5 to constitute the thin plate container 11.

Next, the processing apparatus 31 for the thin plate container 11 is described with reference to FIG. 6.

This processing apparatus 31 represents an entire apparatus for processing the semiconductor wafers W housed in the thin plate container 11. The processing includes various kinds of processing to be performed to the semiconductor wafers W such as grinding, lapping and polishing, washing, etc. It is noted that FIG. 6 shows only a loader/unloader portion for the semiconductor wafers W.

This processing apparatus 31 is constituted to comprise the mounting table 32, a separation mechanism 33, and a loader/unloader 34. The mounting table 32 is a portion for mounting, constraining, and supporting the thin plate container 11. The separation mechanism 33 is a mechanism for separating the thin plate container 11 at an arbitrary location. This separation mechanism 33 is composed of the release key 36 and a lift 37. The release key 36 is a mechanical portion that is inserted into the coupling operation hole 21 of the processing tray 12 to release the coupling at the portion. The release key 36 is adapted to be supported on a guide rail 38 to be able to move to an arbitrary location in an up-down direction. The lift 37 is a mechanical portion that catches the flanges 22 of the processing tray 12 to lift and open the processing tray 12. The lift 37 has the arm that catches the flanges 22 of the processing tray 12. The lift 37 is also adapted to be supported on the guide rail 38 to be able to move to an arbitrary location in an up-down direction in a similar manner as that of the release key 36.

The loader/unloader 34 is a mechanical portion for loading out outside or loading in inside the semiconductor wafer W at the location separated by the separation mechanism 33. This loader/unloader 34 has a means for supporting the semiconductor wafer W such as vacuum tweezers. Also, the loader/unloader 34 is adapted to be supported on a guide rail 39 to be able to move to an arbitrary location in an up-down direction.

The thin plate container 11 constituted as above is operated in the following manner.

Firstly, the processing trays 12 are prepared in accordance with the number of the semiconductor wafers W. Specifically, as many intermediate processing trays 12A and a bottom end processing tray 12C as the number of the semiconductor wafers W are prepared. It is noted that this case is an example in which one semiconductor wafer W is housed in one processing tray 12.

The semiconductor wafers W are respectively housed in the one-side supports 13 of the intermediate processing trays 12A and the bottom end processing tray 12C which are stacked. The bottom end processing tray 12C is placed at the lowest portion, and the intermediate processing trays 12A are stacked thereon. That is, they are stacked, inserting and thrusting each coupling hook 19 into each coupling hole 18 to be coupled with each other. Lastly, the coupling hook 19 of the top end processing tray 12B is thrust into the coupling hole 18 of the uppermost intermediate processing tray 12A to be coupled with each other. By doing so, the thin plate container 11 is constituted.

In this state, each semiconductor wafer W is sandwiched, constrained, and supported between the one-side supports 13 and the other-side support 14. Accordingly, regardless of which is on the upper side, the top end processing tray 12B or the bottom end processing tray 12C, the semiconductor wafers W can be supported reliably.

The thin plate container 11 is carried, then mounted, and constrained on the mounting table 32 of the processing apparatus 31 (FIG. 6 (*a*)). Next, the release keys 36 move to the location of the processing tray 12 supporting the semiconductor wafer W to be processed and are inserted into the coupling operation holes 21 of the processing tray 12 to release the coupling, and the processing tray 12 is separated (FIG. 6 (*b*)).

Subsequently, the arms of the lifts 37 catch the flanges 22 of the processing tray 12 (FIG. 6 (*c*)), and the processing tray 12 is lifted (FIG. 6 (*d*)). Next, the semiconductor wafer W is supported and lifted by the loader/unloader 34 (FIG. 6 (*e*)) and is carried out outside for processing (FIG. 6 (*f*)).

When the processed semiconductor wafer W is to be housed in the thin plate container 11, the processing tray 12 at a location where one desires to return the semiconductor wafer W is separated in a similar manner as above, and the semiconductor wafer W supported by the loader/unloader 34 is mounted on the one-side supports 13. Thereafter, the processing tray 12 lifted by the lifts 37 is lowered, and the coupling hooks 19 are fitted and thrust into the coupling holes 18. This is the end of housing of the semiconductor wafer W.

Consequently, the thin plate container 11 exerts the following effects.

Since the thin plate container 11 is constituted to comprise processing trays 12 plurally stacked in a state of each supporting at least one semiconductor wafer W individually, and a coupling mechanism for integrally coupling the processing trays 12 in a state where the processing trays 12 are plurally stacked and separating the processing trays 12 at an arbitrary location, the number of the processing trays 12 can be set arbitrarily in accordance with the number of the semiconductor wafers W, and the stacked processing trays 12 are separated at an arbitrary location to enable the semiconductor wafer W to be carried in and out at the arbitrary location. Consequently, it is possible to provide an extremely flexible thin plate container that enables the number of the processing trays 12 to be set in accordance with the number of the semiconductor wafers W, unlike a conventional housing container in which the number of wafers that can be housed is predetermined and cannot be changed.

Also, since the processing tray 12 has a one-side support 13 on its one side and the other-side support 14 on the other side, when two processing trays 12 are stacked, the one-side support 13 and the other-side support 14 are fitted to each other to form a housing space, and the semiconductor wafer W can be constrained and supported in this housing space in a state of being sealed off from the external environment. Consequently, by preparing as many processing trays 12 as the number that enables to form as many housing spaces as the number of the semiconductor wafers W, housing one or several semiconductor wafers W in each processing tray 12, and stacking them, the size of the thin plate container can be changed freely in accordance with the number of the semiconductor wafers W.

Also, since the one-side support 13 and the other-side support 14 are fitted to each other to sandwich and constrain the semiconductor wafer W housed in the housing space, and regardless of which is on the upper side, the one-side support 13 or the other-side support 14, the one-side support 13 or the other-side support 14, whichever is on the lower side, supports the semiconductor wafer W, the upper and lower sides of the thin plate container 11 do not need to be distinguished at the time of carriage or storage of the thin plate container 11 or loading-in/out of the semiconductor wafer W in processing phases. Consequently, it is possible to do operations without distinguishing the upper and lower sides of the thin plate container 11, which causes improvement of operability.

Also, since the coupling mechanism consists of a coupling hole 18 provided on one side of each processing tray 12 and a coupling hook 19 provided on the other side and coupled with the coupling hole 18, and the coupling hole 18 and the coupling hook 19 of adjacent processing trays 12 are coupled and constrained to constrain the entirety integrally, and the coupling hole 18 and the coupling hook 19 at an arbitrary location are separated to enable separation into two at the location, the thin plate container 11 can be carried in a state where the entirety is constrained integrally, and then the processing trays 12 can be separated at an arbitrary location, and the semiconductor wafer W at the location can be carried out for a specific processing. Consequently, plural processing trays 12 can be carried in a state where they are constrained integrally, and a specific semiconductor wafer W can be selected from the plural semiconductor wafers W housed therein for processing. Thus, plural semiconductor wafers W each having a different processing content can be carried in one thin plate container 11, and an individual processing can be performed to each semiconductor wafer W.

Also, since on a top end processing tray 12B and a bottom end processing tray 12C located at both ends among the processing trays 12 is formed a kinematic groove 23 to be attached to a processing apparatus 31, and the one-side support 13 supports the semiconductor wafer W in a case where one side of each processing tray 12 is directed upward and the other-side support 14 supports the semiconductor wafer W in a case where the other side is directed upward, the thin plate container 11 can be attached to the processing apparatus 31 reliably regardless of which is directed upward, the upper side or the lower side. Consequently, in a phase in which one side of the semiconductor wafer W is processed and a phase in which the other side is processed, by turning the thin plate container 11 upside down, the semiconductor wafer W does not need to be turned over individually, which causes improvement of operability.

Also, since a gasket for sealing off the housing space is provided at the fitting portion between the one-side support 13 and the other-side support 14 of each processing tray 12, the inside of the housing space can be kept clean. Consequently, when the semiconductor wafer W, whose surface must be kept clean, is carried, the inside of the housing space can be kept clean, and the surface of the semiconductor wafer W can be protected.

Also, since the processing apparatus 31 divides and opens the thin plate container 11 mounted on the mounting table 32 at an arbitrary location by a separation mechanism 33 and carries in and out the semiconductor wafer W by a loader/unloader 34, the semiconductor wafer W at the arbitrary location can be carried in and out easily.

Also, since the separation mechanism is composed of a release key 36 for separating processing trays 12 of the thin plate container 11 at an arbitrary location and a lift 37 for lifting the processing tray 12 at the location separated by the release key 36, the stacked processing trays 12 can be separated by the release key 36 and be lifted up by the lift 37. Consequently, the plurally stacked processing trays 12 can be separated at the arbitrary location easily to be able to carry in and out the semiconductor wafer W.

INDUSTRIAL APPLICABILITY

Although the above embodiment has been explained taking a 300 mm semiconductor wafer W as an example thin plate, the size of the thin plate shall not matter. For example, as a small thin plate, a semiconductor wafer W having a diameter of about 1 centimeter exists. As a large thin plate, a glass substrate for liquid crystal of about 120 cm by 240 cm exists. A yet larger thin plate may exist. The similar effects to those of the above embodiment are exerted on these by applying the present invention.

Also, although the thin plate container 11 is mounted in a vertical direction to be divided vertically in the above embodiment, it may be mounted and divided in a tilted direction or in a horizontal direction as needed. For example, in testing phases of a glass substrate for liquid crystal, the glass substrate for liquid crystal is tested in a tilted state in some cases, and the thin plate container 11 may be tilted to conform to such a case.

Also, the coupling mechanism may be constituted to comprise a guide means such as a support for supporting and guiding each processing tray 12 and a clamp for integrally constraining the entire processing trays 12 each supported and guided by the guide means and separating the processing trays 12 into two at an arbitrary location. This clamp is constituted to comprise a hook that integrally supports the stacked processing trays 12 and a hook that supports and separates the two respective processing trays 12 on the upper and lower sides at an arbitrary location, for example. Thus, the thin plate container 11 can be carried in a state where the entirety is constrained integrally, and then the processing trays 12 can be separated at an arbitrary location, and the semiconductor wafer W at the location can be carried out for a specific processing, in a similar manner to the above. Consequently, plural processing trays 12 can be carried in a state where they are constrained integrally, and a specific semiconductor wafer W can be selected from the plural semiconductor wafers W housed therein for processing. Thus, plural semiconductor wafers W each having a different processing content can be carried in one thin plate container 11, and an individual processing can be performed to each semiconductor wafer W.

The invention claimed is:
1. A processing apparatus for a thin plate container, the processing apparatus comprising:

a thin plate container for supporting one or plural thin plates for use in carriage, storage, and processing, the thin plate container comprising:
- a plurality of processing trays arranged in a stack, each processing tray supporting at least one thin plate;
- a coupling mechanism for integrally coupling together said plurality of processing trays in the stack and allowing said processing trays to be separated at any location within the stack,
- wherein said each processing tray includes first side and second side supports for supporting opposing sides of at least one thin plate, said first and second side supports mutually fitting together to form a housing space sealed off from the external environment for constraining and supporting said thin plate sandwiched therebetween within the housing space;
- a mounting table for mounting the thin plate container;
- a separation mechanism for separating and opening the thin plate container mounted on said mounting table at any location within said stack; and
- a loader/unloader for loading in and out a thin plate housed at the arbitrary location opened by said separation mechanism.

2. The thin plate container according to claim 1, wherein said first and second side supports respectively have a round protrusion and a round recess which mates with said round protrusion to define the housing space therebetween, whereby said first side functions as a lid side, and said second side support functions as a container side, to support said thin plate.

3. The thin plate container according to claim 1, wherein said coupling mechanism comprises a coupling portion provided an one of said support sides of each processing tray and a coupled portion provided on the other of said support sides of each processing tray and coupled with said coupling portion, and said coupling portion is coupled to said coupled portion of at least one adjacent processing tray to hold the entire stack as an integral unit, and wherein a coupled coupling portion and coupled portion may be separated at an arbitrary location to enable the stack to be separated into two at any location within the stack.

4. The thin plate container according to claim 1, wherein said coupling mechanism comprises a guide means for supporting and guiding said each processing tray and a clamp for integrally holding said entire stack of processing trays, each processing tray being supported and guided by said guide means and allowing said stack to be separated into two at any location within the stack.

5. The thin plate container according to claim 1, wherein the processing trays located at each of opposing ends of the stack has a kinematic groove for attachment to a processing apparatus, and
- wherein said first side support supports said thin plate in a case where one end of said stack is uppermost and said second side support supports said thin plate in a case where the other end of said stack is uppermost.

6. The thin plate container according to claim 1, wherein a gasket for sealing off said housing space is provided between said first and second side portions of each processing tray.

7. The processing apparatus for a thin plate container according to claim 1, wherein said separation mechanism comprises a release key for separating processing trays of the thin plate container at any location within the stack and a lift for lifting each processing tray from the arbitrary location.

8. The thin plate container according to claim 1 wherein each processing tray contains a single thin plate.

* * * * *